United States Patent
Kamigaichi et al.

(10) Patent No.: US 7,369,439 B2
(45) Date of Patent: May 6, 2008

(54) SEMICONDUCTOR INTEGRATED CIRCUIT DEVICE HAVING NONVOLATILE SEMICONDUCTOR MEMORY AND PROGRAMMING METHOD THEREOF

(75) Inventors: Takeshi Kamigaichi, Yokohama (JP); Kikuko Sugimae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 220 days.

(21) Appl. No.: 11/397,725

(22) Filed: Apr. 5, 2006

(65) Prior Publication Data

US 2006/0239069 A1    Oct. 26, 2006

(30) Foreign Application Priority Data

Apr. 20, 2005   (JP)   ............... 2005-122559

(51) Int. Cl.
   *G11C 16/04*   (2006.01)
(52) U.S. Cl. ............................. 365/185.17; 365/185.23
(58) Field of Classification Search ........... 365/185.17, 365/185.23, 185.18
See application file for complete search history.

(56) References Cited

U.S. PATENT DOCUMENTS 5,973,962 A * 10/1999 Kwon ................... 365/185.18
6,011,287 A   1/2000 Itoh et al.
6,720,612 B2  4/2004 Takeuchi et al.
6,804,150 B2 * 10/2004 Park et al. ............. 365/185.18
2002/0145907 A1  10/2002 Byeon et al.
2003/0048662 A1 * 3/2003 Park et al. ............. 365/185.18

FOREIGN PATENT DOCUMENTS

JP           10-302488        11/1998
JP           2002-280463       9/2002

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor integrated circuit device includes a memory cell array having a plurality of memory cell transistors arranged in a matrix form. The device further includes a high-voltage circuit area arranged in a peripheral area of the memory cell array and including a first high-voltage transistor having a current path which is connected at one end to a selected control gate and a second high-voltage transistor having a current path which is connected at one end to a first non-selected control gate adjacent to the selected control gate and configured to raise voltage applied to the selected control gate to program voltage by use of first capacitive coupling caused between the selected control gate and the first non-selected control gate by applying intermediate voltage approximately equal to voltage which makes the current path of the memory cell transistor conductive to the first non-selected control gate.

12 Claims, 8 Drawing Sheets

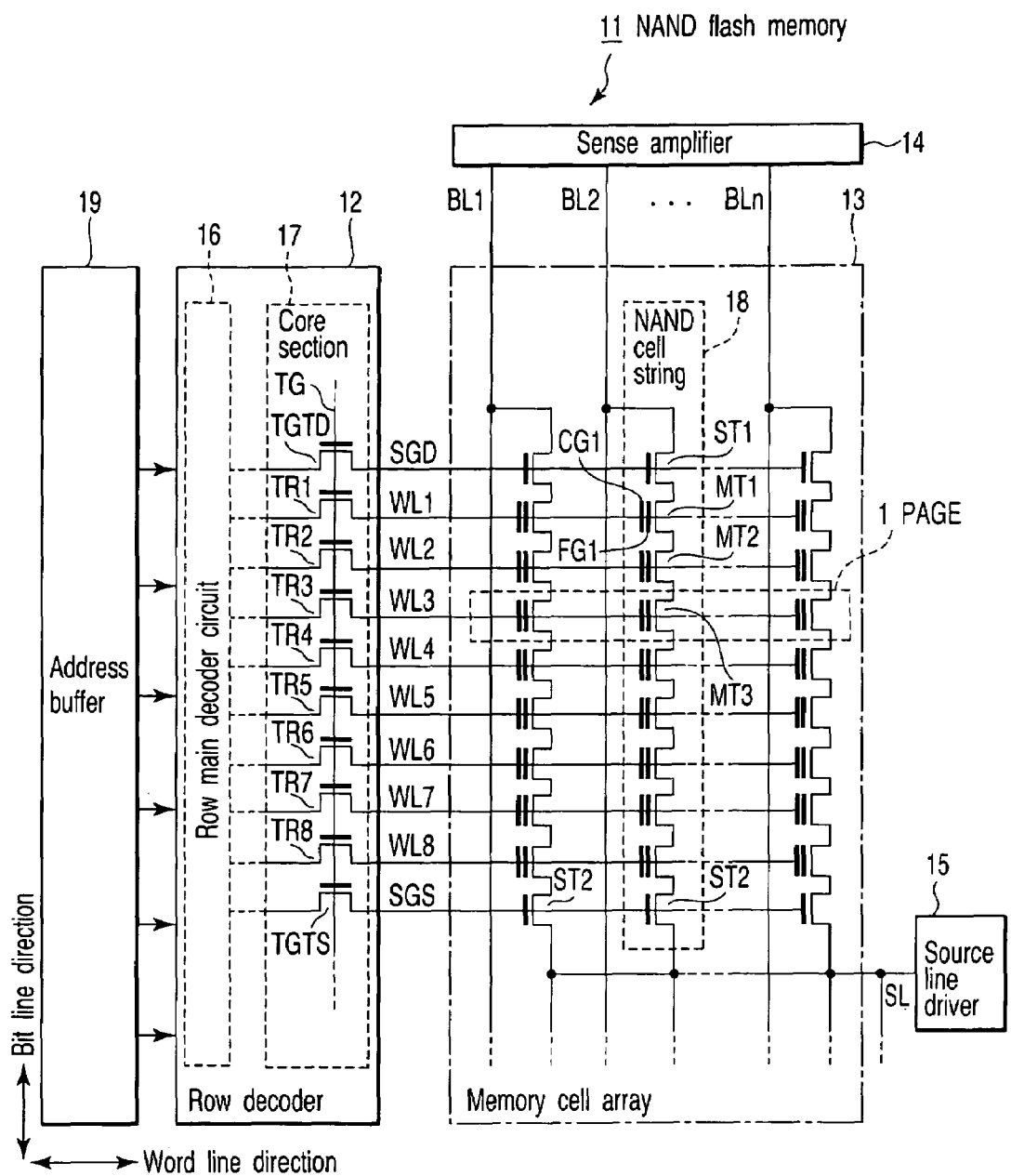
F I G. 1

SEMICONDUCTOR INTEGRATED CIRCUIT DEVICE HAVING NONVOLATILE SEMICONDUCTOR MEMORY AND PROGRAMMING METHOD THEREOF

CROSS-REFERENCE TO RELATED APPLICATIONS

This application is based upon and claims the benefit of priority from prior Japanese Patent Application No. 2005-122559, filed Apr. 20, 2005, the entire contents of which are incorporated herein by reference.

BACKGROUND OF THE INVENTION

1. Field of the Invention

This invention relates to a semiconductor integrated circuit device and a programming method thereof and is applied to a semiconductor integrated circuit device having a NAND flash memory, for example.

2. Description of the Related Art

Conventionally, high voltage is applied to high-voltage transistors such as transfer transistors arranged in the row decoder of a NAND flash memory, for example. High voltage (Vpgm+Vth, Vpgm or the like) necessary to transfer so-called program voltage Vpgm to a selected word line is applied to the control gate of the transfer transistor.

For example, in Jpn. Pat. Appln. KOKAI Publication No. H10-302488, an example in which program voltage Vpgm is transferred to the control gate by use of the high-voltage transistor is disclosed. Recently, the voltage value of the program voltage tends to increase with an increase in the number of memory cells.

Further, since the voltage value of the program voltage is approximately 18V and extremely high, for example, there is a tendency that the gate insulating film is destroyed and so-called field inversion occurs via an element isolation insulating film between adjacent high-voltage transistors. Therefore, it is necessary to make the film thickness of the gate insulating film larger and increase the distance between the adjacent high-voltage transistors.

As a result, the cell area is increased, and it becomes difficult to attain high integration density and it is disadvantageous in forming a highly fine pattern.

BRIEF SUMMARY OF THE INVENTION

A semiconductor integrated circuit device according to a first aspect of the invention comprises a memory cell array having a plurality of memory cell transistors arranged in a matrix form, each of the memory cell transistors including a floating gate formed on a gate insulating film, a inter-gate insulating film provided on the floating gate and a control gate provided on the inter-gate insulating film, and a high-voltage circuit area arranged in a peripheral area of the memory cell array and including a first high-voltage transistor having a current path which is connected at one end to a selected control gate and a second high-voltage transistor having a current path which is connected at one end to a first non-selected control gate adjacent to the selected control gate and configured to raise voltage applied to the selected control gate to program voltage by use of first capacitive coupling caused between the selected control gate and the first non-selected control gate by applying intermediate voltage approximately equal to voltage which makes the current path of the memory cell conductive to the first non-selected control gate.

A programming method of a semiconductor integrated circuit device according to a second aspect of the invention which includes a memory cell array having a plurality of memory cell transistors arranged in a matrix form, each of the memory cell transistors including a floating gate formed on a gate insulating film, a inter-gate insulating film provided on the floating gate and a control gate provided on the inter-gate insulating film, comprises applying voltage lower than program voltage to a selected control gate of a selected one of the memory cell transistors, and raising voltage applied to the selected control gate to the program voltage by use of first capacitive coupling caused between the selected control gate and a first non-selected control gate by applying intermediate voltage approximately equal to voltage which makes the current path of the memory cell transistor conductive to the first non-selected control gate of a non-selected memory cell transistor adjacent to the selected control gate.

BRIEF DESCRIPTION OF THE SEVERAL VIEWS OF THE DRAWING

FIG. 1 is a circuit diagram showing a semiconductor integrated circuit device according to a first embodiment of this invention;

DETAILED DESCRIPTION OF THE INVENTION

Figure 2:
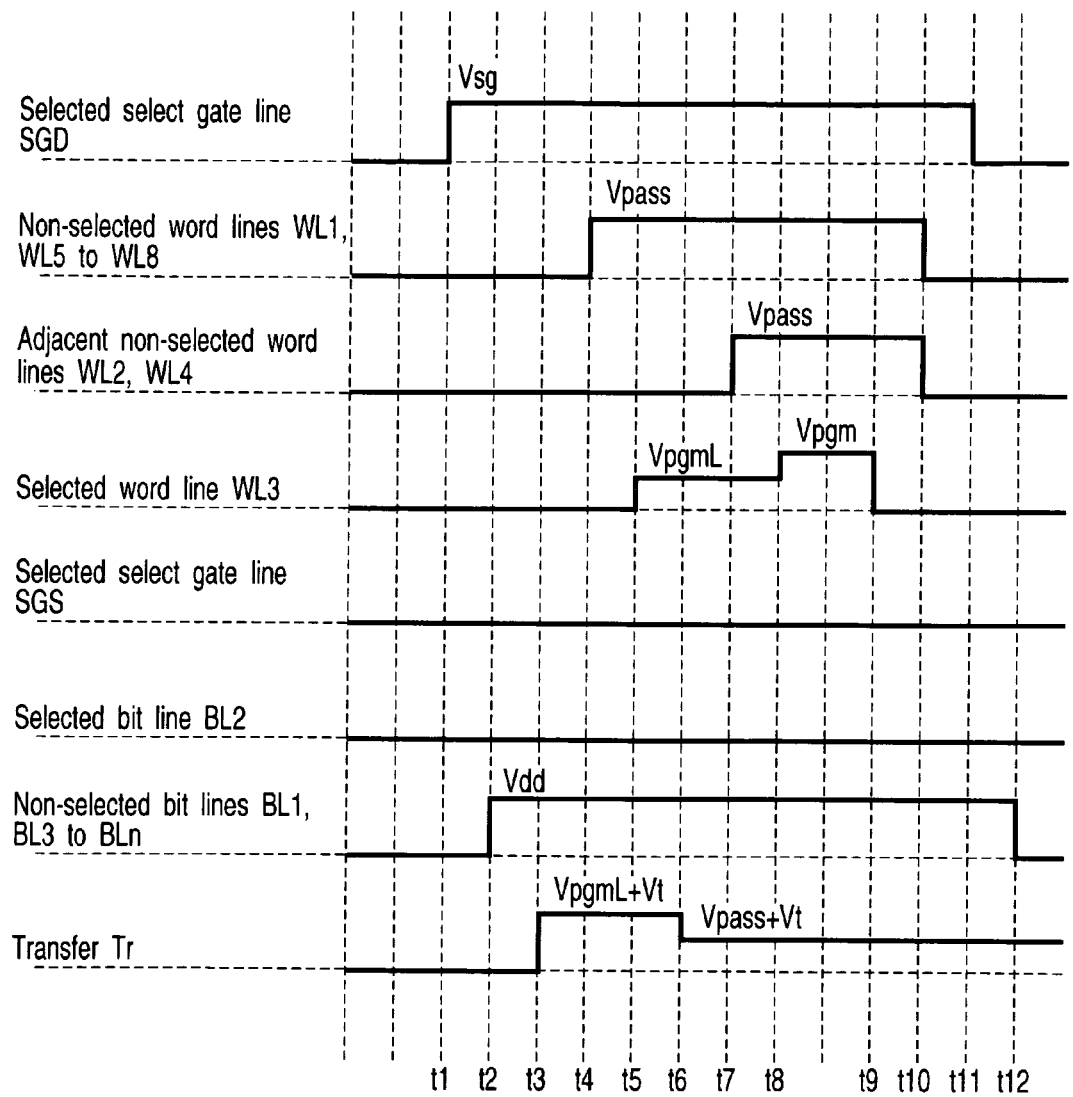
FIG. 2 is a timing chart showing the programming operation of the semiconductor integrated circuit device according to the first embodiment.

There will now be described embodiments of this invention with reference to the accompanying drawings. In this explanation, common reference symbols are attached to like portions throughout the drawings.

First Embodiment

First, a NAND flash memory is used as a semiconductor integrated circuit device according to a first embodiment of this invention and explained with reference to FIG. 1. FIG. 1 is a plan view schematically showing a memory cell array of the NAND flash memory and a peripheral circuit thereof.

As shown in FIG. 1, a NAND flash memory 11 includes an address buffer 19, row decoder 12, memory cell array 13, sense amplifier 14 and source line driver 15.

The address buffer 19 is configured to supply an address which is decoded by the row decoder 12.

The row decoder 12 is configured to selectively activate word lines WL1 to WL8 and select gate lines SGD, SGS according to an address from the address buffer 13. Further, the row decoder 12 has a row main decoder circuit 16 and core section (row sub-decoder circuit) 17. The row main decoder circuit 16 decodes a row address signal and supplies a row address decoded signal to the core section 17. The core section 17 has transfer gate transistors TGTD, TGTS and high-voltage transistors (transfer transistors) TR1 to TR8 whose gates are connected to a transfer gate line TG.

The memory cell array 13 has a plurality of NAND cells 18 arranged in a matrix form. Each of the NAND cells 18 has eight memory cell transistors MT and selection transistors ST1, ST2. The memory cell transistor MT has a laminated structure having a floating gate FG formed above the main surface of a semiconductor substrate with a gate insulating film disposed therebetween, a inter-gate insulating film formed on the floating gate FG and a control gate CG formed on the inter-gate insulating film (not shown). The adjacent memory cell transistors MT commonly have a source/drain region. The current paths of the memory cell transistors are serially connected between the selection transistors ST1 and ST2. The number of memory cell transistors MT is not limited to eight and can be set to 16, 32 or the like. Further, both of the selection transistors ST1, ST2 are not always necessary. If the NAND cell 18 can be selected, only one of the selection transistors ST1 and ST2 need be provided.

The control gates of the memory cell transistors MT which are arranged on the same column are commonly connected to a corresponding one of the word lines WL1 to WL8. The selection transistors ST1 and ST2 which are arranged on the same row are respectively connected to the select gate lines SGD and SGS. The drains of the selection transistors ST1 which are arranged on the same row are commonly connected to a corresponding one of bit lines BL1 to BLn. The sources of the selection transistors ST2 are commonly connected to a source line SL and connected to the source line driver 15.

The sense amplifier 14 is configured to amplify data read out from the selected memory cell transistor MT.

The source line driver 15 is configured to generate a source voltage and apply the source voltage to the source line SL.

<Programming Operation>

Next, the programming operation of the selected memory transistor MT is explained with reference to FIGS. 2 to 8 by extracting necessary portions of the memory cell array 13 and core section 17 shown in FIG. 1.

Figure 4:
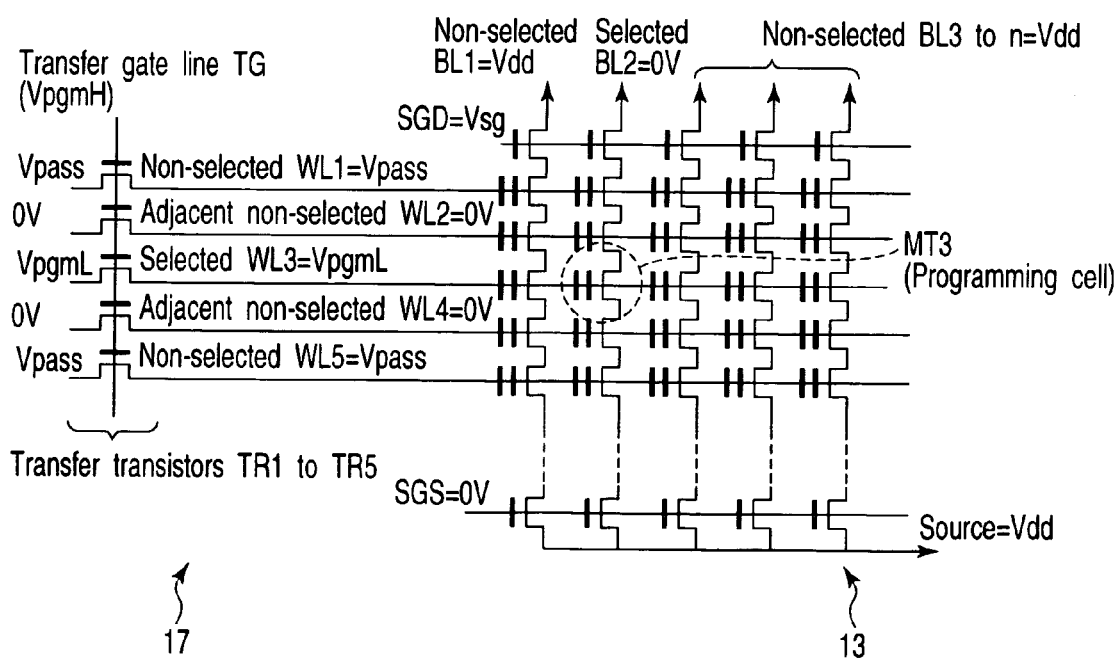
FIG. 4 is a circuit diagram showing the programming operation of the semiconductor integrated circuit device according to the first embodiment.
Figure 5:
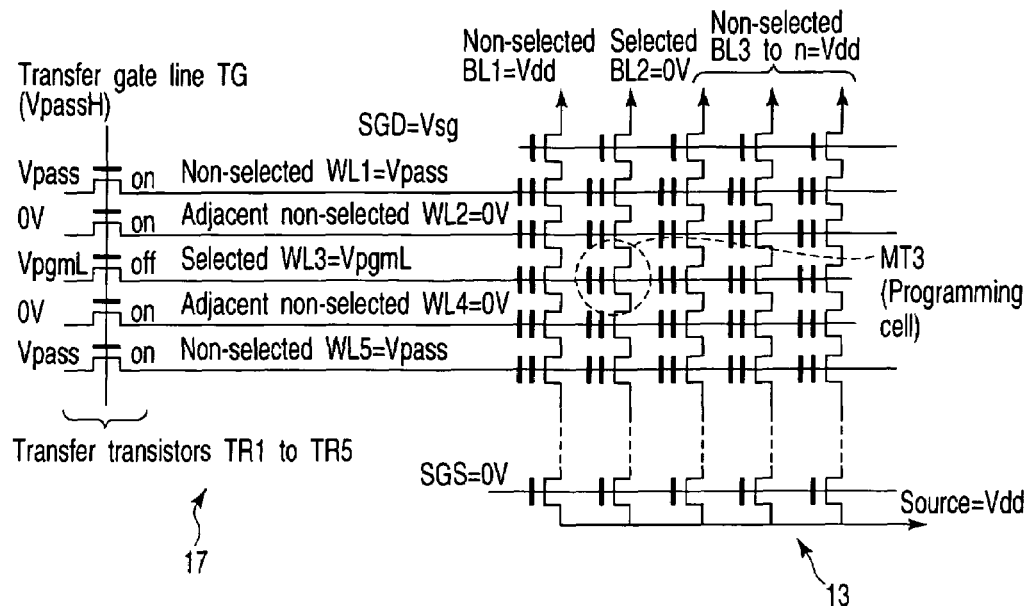
FIG. 5 is a circuit diagram showing the programming operation of the semiconductor integrated circuit device according to the first embodiment.
Figure 6:
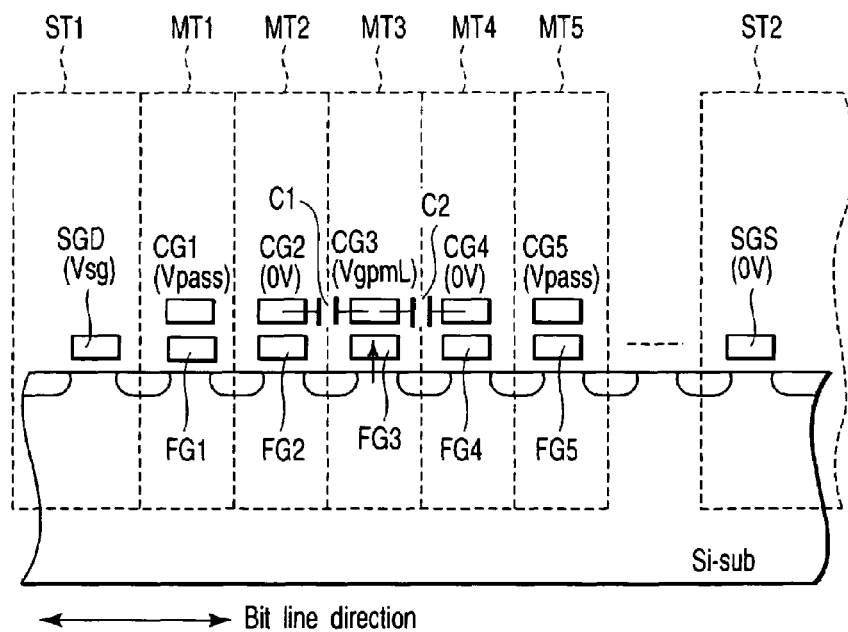
FIG. 6 is a cross sectional view showing the programming operation of the semiconductor integrated circuit device according to the first embodiment.
Figure 7:
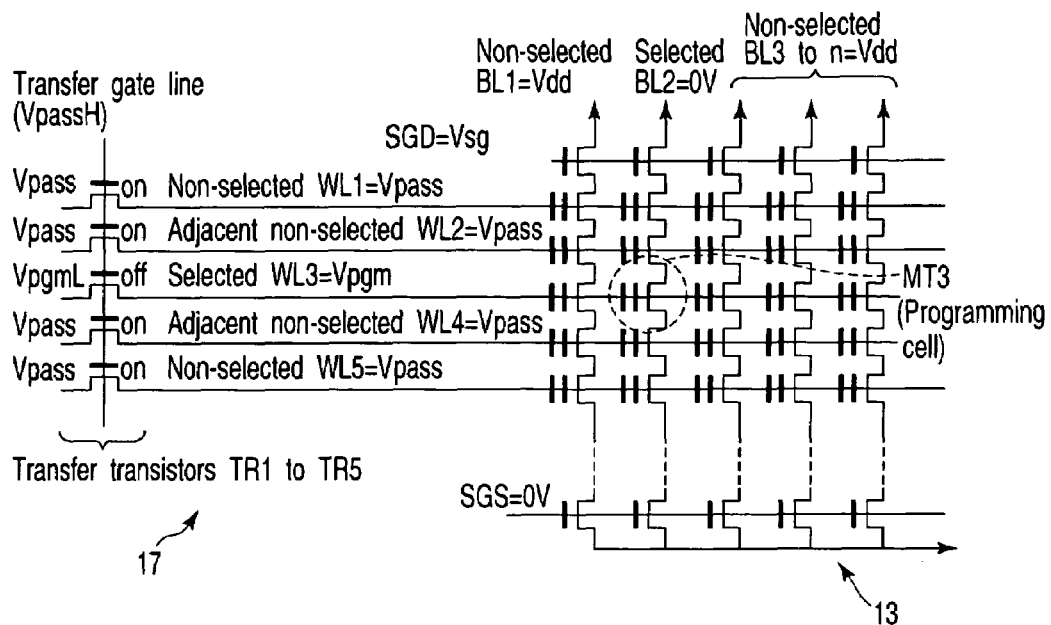
FIG. 7 is a circuit diagram showing the programming operation of the semiconductor integrated circuit device according to the first embodiment.
Figure 8:
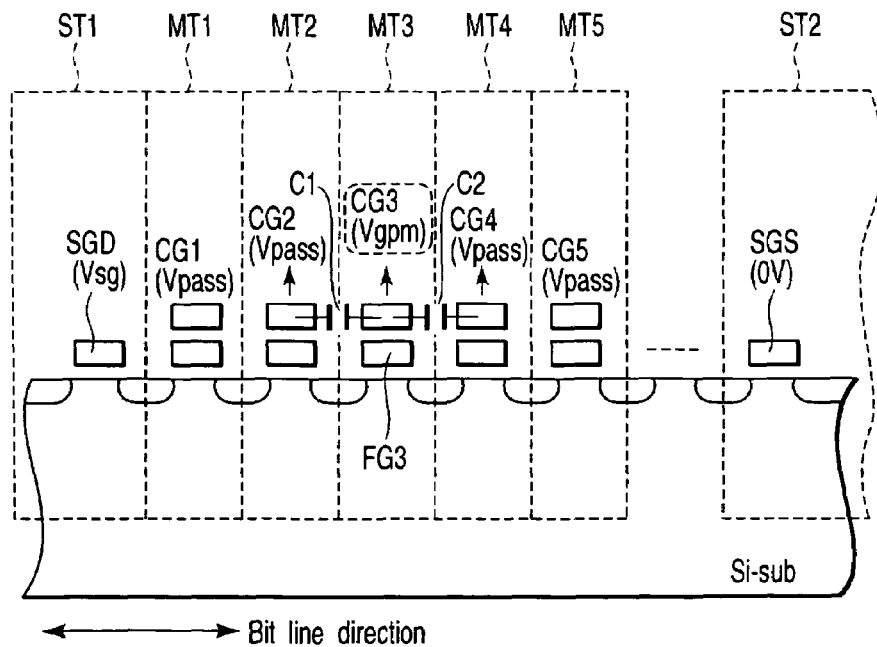
FIG. 8 is a cross sectional view for illustrating the programming operation of the semiconductor integrated circuit device according to the first embodiment.

FIG. 2 is a timing chart showing the programming operation of the semiconductor integrated circuit device according to the present embodiment. FIGS. 3 to 5 and FIG. 7 are circuit diagrams for illustrating the programming operation of the semiconductor integrated circuit device according to the present embodiment. FIGS. 6 and 8 are cross sectional views showing the memory cell array in the direction of the bit line BL, for illustrating the programming operation sequence of the semiconductor integrated circuit device according to the present embodiment. In the explanation of the operation, the operation is explained according to time shown in the timing chart of FIG. 2.

As shown in FIG. 2, first, initial voltage Vsg is applied in the initialization operation for programming to the selected select gate line SGD at time t1.

Figure 3:
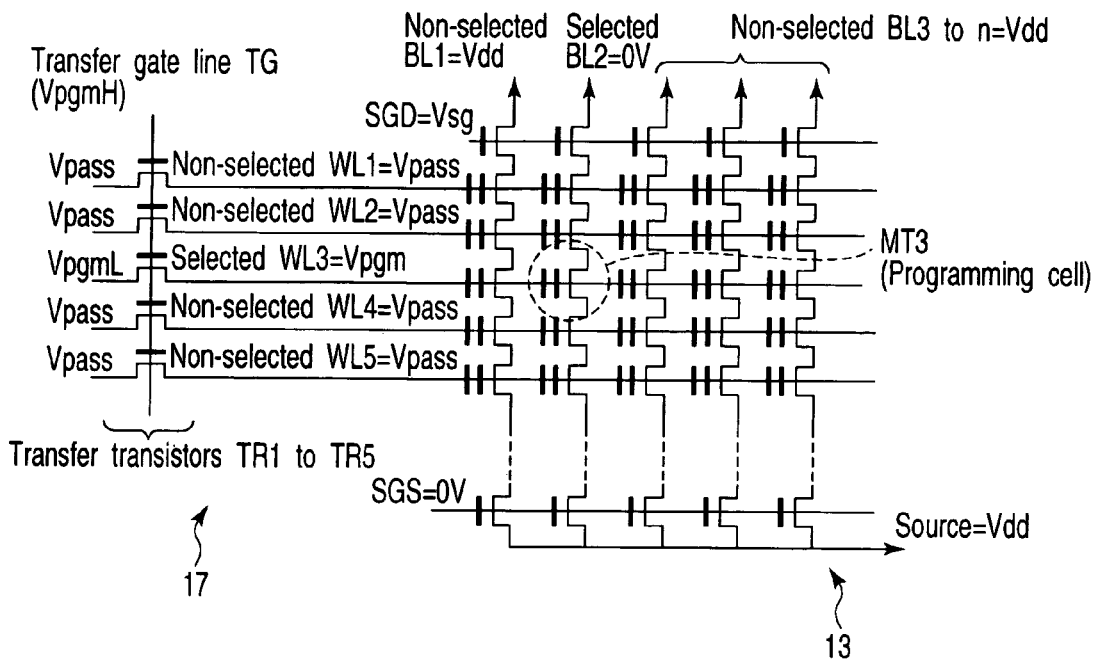
FIG. 3 is a circuit diagram showing the programming operation of the semiconductor integrated circuit device according to the first embodiment.

Then, at time t2, voltage Vdd is applied to the non-selected bit lines BL1 and BL3 to BLn respectively connected to the non-selected NAND cell strings and (Vsg-Vth (<Vdd)) is transferred to the non-selected NAND cell strings. At the time t2, since the selected select gate line SGD is set into the cutoff state when (Vsg-Vth) is transferred to the NAND string and 0V is applied to the selected select gate line SGS of the selection transistor ST2 to set the same into the cutoff state, the channel of each non-selected NAND cell string is set into an electrically floating state. At the same time, 0V is applied to the selected bit line BL2 connected to the selected NAND cell string to apply 0V to the selected NAND cell string (FIG. 3).

Next, at time t3, sufficiently high voltage (VpgmH) is applied to the transfer gate line TG (the gate of the transfer transistor TR3). Then, at time t4, intermediate potential Vpass is applied to the non-selected word lines WL1 and WL5 to WL8. Further, at time t5, VpgmL (<VpgmH) is applied to the selected word line WL3. At the time t5, 0V is applied to the word lines WL2, WL4 which are adjacent to the word line WL3 (FIG. 4).

After this, the non-selected word lines WL1 and WL3 to WL8, adjacent non-selected word lines WL2, WL4 and selected word line WL3 are charged until the potentials applied thereto become sufficiently high. Then, at time t6, the voltage of the control gate of the transfer transistor is lowered to VpassH. In this case, the voltage VpassH at the time t6 is voltage which is sufficiently high to permit the intermediate potential Vpass to be transferred and is voltage which permits the transfer transistor to be set into the cutoff state when the voltage VpgmL is applied to the diffusion layer of the transfer transistor. That is, VpgmL charged on the selected word line WL3 at this time is not discharged (FIG. 5).

As shown in FIG. 6, at the time t6, capacitive couplings C1, C2 are formed between the control gate CG3 connected to the selected word line WL3 and the control gates CG2 and CG4 respectively connected to the adjacent non-selected word lines WL2, WL4. In other words, at the time t6, the operation is similar to the programming operation of a so-called local self boost (LSB) system.

Next, at time t7, when the intermediate potential Vpass is applied to the adjacent non-selected word lines WL2, WL4, the program voltage Vpgm is boosted and applied to the selected word line WL3 at time t8.

That is, as shown in FIG. 8, when the intermediate potential Vpass is applied to the adjacent non-selected word lines WL2, WL4 at the time t7, the channels of all of the memory cell transistors MT1 to MT8 of the cell string are made conductive and voltage of the control gate CG3 surrounded by broken lines and connected to the selected word line WL3 is raised by use of the capacitive couplings C1, C2 and boosted to the program voltage Vpgm which is required to program the cell at the time t8. Therefore, the memory cell transistor MT3, which is a programming cell, comes to have desired threshold voltage and electrons are injected into the floating gate FG3 thereof to perform the programming operation. In other words, at the times t7, t8, the operation is similar to the programming operation of a so-called self boost (SB) system.

Further, at the time t8, as described above, since the control gate voltage of the transfer transistor TR is set to VpassH, voltage of the selected word line WL3 is not discharged.

Next, at time t9, the potential of the selected word line WL3 is discharged to approximately 0V.

Then, at time t10, the non-selected word lines WL1 and WL5 to WL8 and adjacent word lines WL2 and WL4 are discharged to approximately 0V.

After this, at time t11, the selected select gate line SGD is discharged to a voltage of approximately 0V.

Then, at time t12, the non-selected bit lines BL1 and BL3 to BLn are discharged to a voltage of approximately 0V.

As described above, in the semiconductor integrated circuit device according to the present embodiment, at the time t4, t5, the intermediate potential Vpass is applied to the non-selected word lines WL1 and WL5 to WL8, 0V is applied to the adjacent word lines WL2, WL4 and the voltage VpgmL is applied to the selected word line WL3. Therefore, the capacitive couplings C1, C2 are formed between the control gate CG3 connected to the selected word line WL3 and the control gates CG2, CG4 respectively connected to the adjacent non-selected word lines WL2, WL4 (FIG. 6).

Then, if the intermediate potential Vpass is applied to the adjacent non-selected word lines WL2, WL4 at the time t7, the program voltage Vpgm is boosted and applied to the selected word line WL3 at the time t8 and electrons are injected into the floating gate FG3 of the desired memory cell transistor MT3 to complete the programming operation. That is, if the intermediate potential Vpass is applied to the adjacent non-selected word lines WL2, WL4, the channels of all of the memory cell transistors MT1 to MT8 of the cell string are made conductive and voltage of the control gate CG3 connected to the selected word line WL3 is raised by use of the capacitive couplings C1, C2 and boosted to the necessary program voltage Vpgm. In other words, the program voltage applied to the word line used for programming is raised by use of the capacitive coupling with the word lines of the adjacent non-programming cells and a desired program voltage can be temporarily attained (FIG. 8).

As a result, the program voltage applied to the selected word line WL3 can be lowered to the voltage VpgmL which is lower than the program voltage Vpgm. Therefore, the film thickness of the gate insulating film and the distance between the adjacent transfer transistors TR can be reduced, which is advantageous when miniaturizing the semiconductor integrated circuit device.

The degree of the capacitive couplings C1, C2 increases with a reduction in the distance between the control gates CG1 to CG5. Therefore, with miniaturization, the distance between the control gates CG1 to CG5 of the adjacent memory cell transistors MT1 to MT8 is reduced, which advantageous in increasing the degree of the capacitive couplings. As a result, it is advantageous in more effectively exhibiting the effect of a reduction in the program voltage by further lowering the voltage VpgmL with miniaturization.

Second Embodiment (Sequence Utilizing one of Capacitive Couplings)

Next, a semiconductor integrated circuit device according to a second embodiment of this invention is explained with reference to FIGS. 9 to 12. The present embodiment relates to the programming operation by utilizing one of the capacitive couplings in the programming operation explained in the first embodiment. In the following explanation, the explanation for those corresponding to the portions of the first embodiment is omitted.

Figure 9:
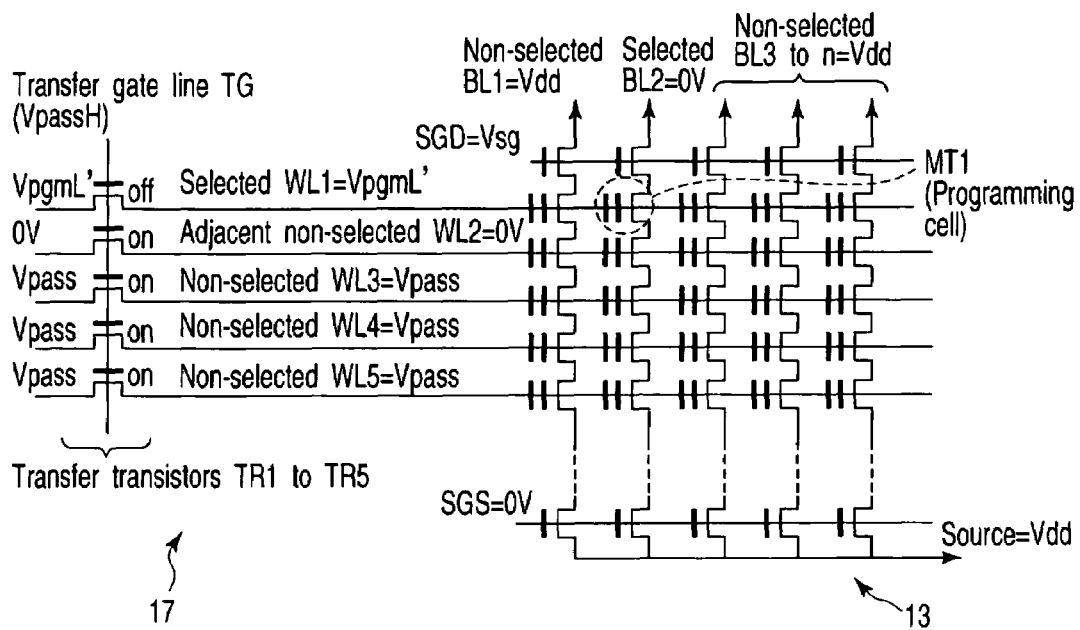
FIG. 9 is a circuit diagram showing the programming operation of the semiconductor integrated circuit device according to a second embodiment of this invention.
Figure 10:
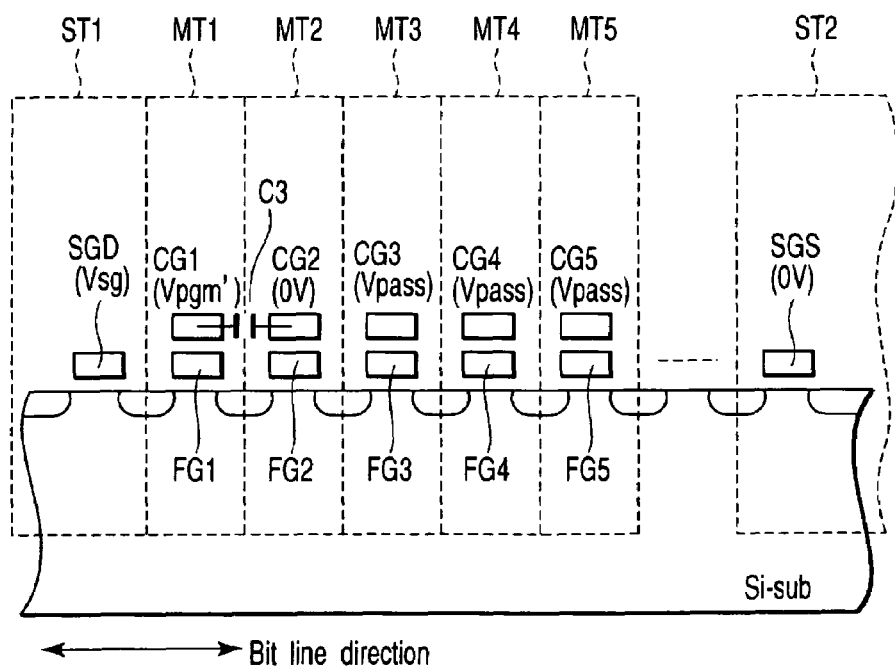
FIG. 10 is a cross sectional view for illustrating the programming operation of the semiconductor integrated circuit device according to the second embodiment.
Figure 11:
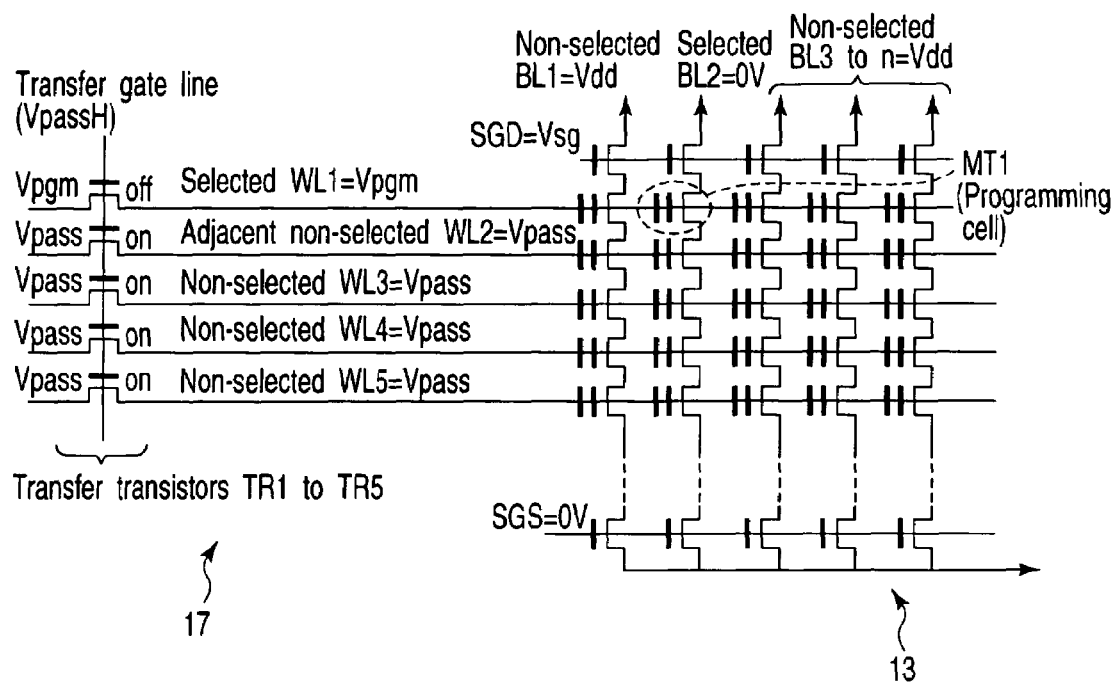
FIG. 11 is a circuit diagram showing the programming operation of the semiconductor integrated circuit device according to the second embodiment.
Figure 12:
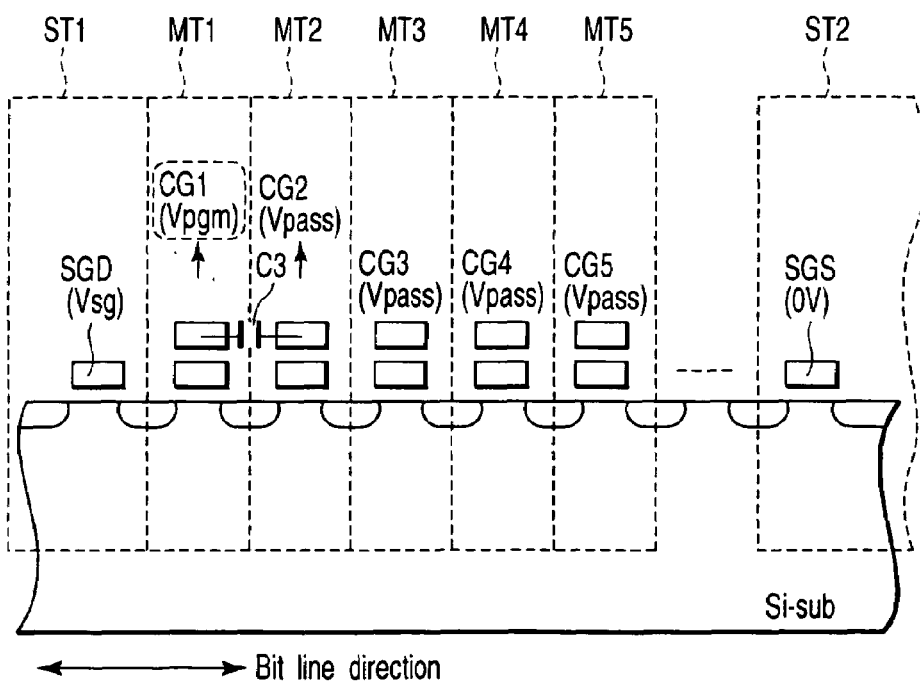
FIG. 12 is a cross sectional view showing the programming operation of the semiconductor integrated circuit device according to the second embodiment.

FIGS. 9 and 11 are circuit diagrams for illustrating the programming operation of the semiconductor integrated circuit device according to the present embodiment. FIGS. 10 and 12 are cross sectional views for illustrating the programming operation of the semiconductor integrated circuit device according to the present embodiment.

In the present embodiment, a case wherein the memory cell transistor MT1 is used as a cell to be programmed, the bit line BL2 is used as a selected bit line and the word line WL1 is used as a selected word line is explained as an example.

First, after the same operation as the above operation is performed, the non-selected word lines WL3 to WL8, adjacent non-selected word line WL2 and selected word line WL1 are charged to a sufficiently high potential as shown in FIG. 9. Then, the control gate voltage of the transfer transistor is lowered to VpassH. At this time, the voltage VpassH at the time t6 is sufficiently high voltage to permit the intermediate voltage Vpass to be transferred and set the transfer transistor into a cutoff state when the voltage VpgmL is applied to the diffusion layer of the transfer transistor. That is, VpgmL' charged on the selected word line WL1 at this time is not discharged.

In this case, the voltage VpgmL' charged on the selected word line WL1 is a voltage higher than the voltage VpgmL.

Further, as shown in FIG. 10, capacitive coupling C3 occurs at the operation time only between the control gate CG1 connected to the selected word line WL1 and the control gate CG2 connected to the adjacent non-selected word line WL2.

Next, as shown in FIG. 11, if the intermediate potential Vpass is applied to the adjacent non-selected word line WL2, then the program voltage Vpgm is boosted and applied to the selected word line WL1.

That is, as shown in FIG. 12, if the intermediate potential Vpass is applied to the adjacent non-selected word line WL2 at the operation time, the channels of all of the memory cell transistors MT1 to MT8 of the cell string are made conductive and voltage of the control gate CG1 surrounded by the broken lines and connected to the selected word line WL1 is raised by use of the capacitive coupling C3 and boosted to the program voltage Vpgm necessary for cell programming. Therefore, the threshold voltage of the memory cell transistor MT1, which is a programming cell, is set to a desired value and electrons are injected into the floating gate FG3 thereof to perform the programming operation.

As described above, according to the programming operation of the semiconductor integrated circuit device of the present embodiment, the same effect as that of the first embodiment can be attained.

Further, in the present embodiment, first, the capacitive coupling C3 is formed only between the control gate CG1 connected to the selected word line WL1 and the control gate CG2 connected to the adjacent non-selected word line WL2 (FIG. 10). Then, the intermediate voltage Vpass is applied to the adjacent non-selected word line WL2 to boost the potential of the selected word line WL1 to a desired programming voltage Vpgm.

Therefore, since it is only necessary to perform the control operation so as to form the capacitive coupling C3 associated with only one of the control gates which is adjacent to the selected control gate CG1, an erroneous programming operation can be prevented and the reliability can be enhanced.

[Cross Sectional Structure]

The cross sectional structure of the semiconductor integrated circuit device of the first and second embodiments is explained with reference to FIGS. 13 and 14.

Figure 13:
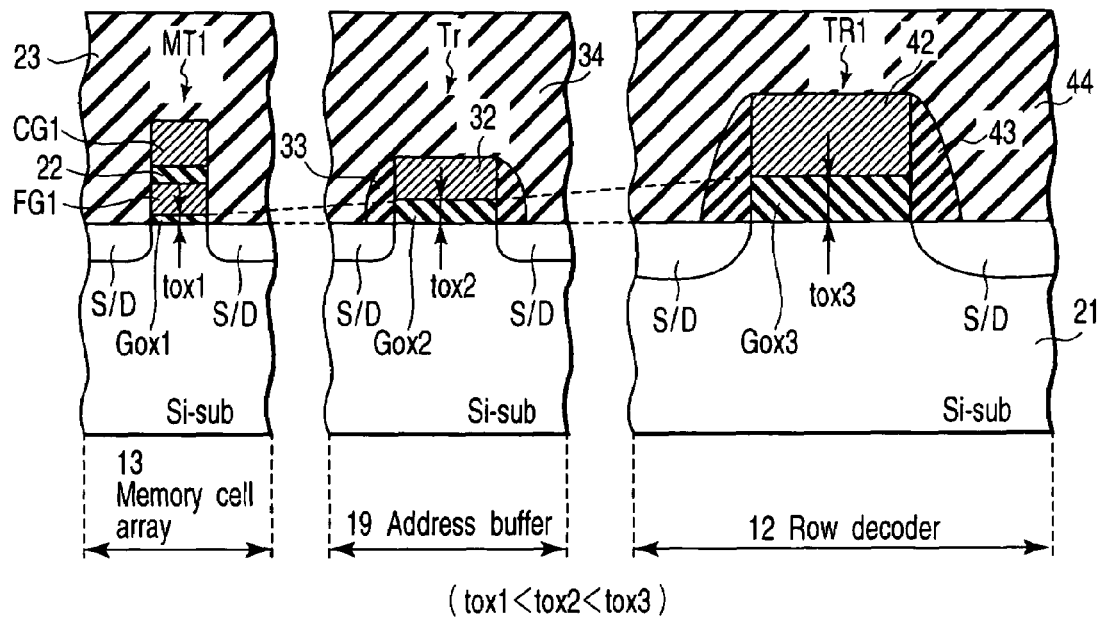
FIG. 13 is a cross sectional view showing the cross sectional structure of the semiconductor integrated circuit device according to the first and second embodiments.
Figure 14:
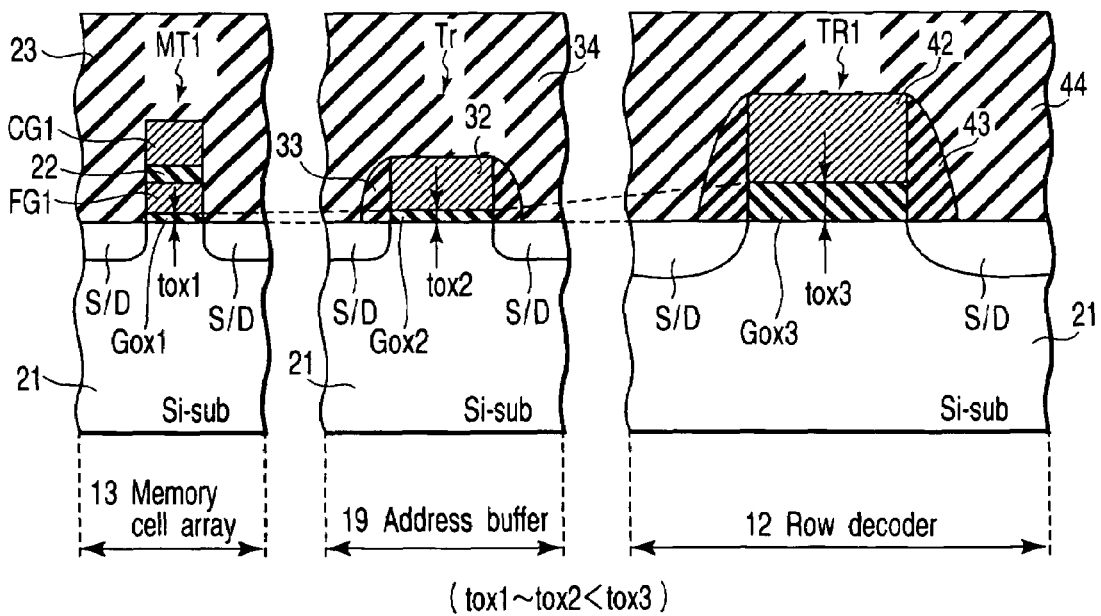
FIG. 14 is a cross sectional view showing the cross sectional structure of the semiconductor integrated circuit device according to the first and second embodiments.

FIGS. 13 and 14 are cross sectional views each showing the cross sectional structures of the memory cell array 13, address buffer 19 and row decoder 12 of FIG. 1.

As shown in the drawing, the memory cell array (cell array area) 13 includes the memory cell transistor MT1, which is a nonvolatile memory cell formed on the semiconductor substrate 21.

The memory cell transistor MT1 has a laminated structure including a gate insulating film Gox1 having a thickness of tox1, floating gate FG1, inter-gate insulating film 22 and control gate CG1 which are sequentially formed on the substrate 21. Further, it includes source/drain regions S/D separately formed in the substrate 21 to sandwich the laminated structure. An insulating layer 23 is formed to cover the memory cell transistor MT1.

The address buffer (low-voltage circuit area) 19 includes low-voltage peripheral transistors Tr arranged in the peripheral area of the memory cell array 13 and formed on the substrate 21.

The peripheral transistor Tr includes a gate insulating film Gox2 having a thickness of tox2 and formed on the substrate 21, a gate electrode 32 formed on the gate insulating film Gox2, spacers 33 formed on the side walls of the gate electrode 32 and source/drain regions S/D separately formed in the substrate 21 to sandwich the gate electrode 32. Further, an insulating layer 34 is formed to cover the peripheral transistor Tr.

The row decoder (high-voltage circuit area) 12 includes high-voltage transfer transistors TR1 arranged in the peripheral area of the memory cell array 13 and formed on the substrate 21.

The transfer transistor TR1 includes a gate insulating film Gox3 having a thickness of tox3 and formed on the substrate 21, a gate electrode 42 formed on the gate insulating film Gox3, spacers 43 formed on the side walls of the gate electrode 42 and source/drain regions S/D separately formed in the substrate 21 to sandwich the gate electrode 42. Further, an insulating layer 44 is formed to cover the transfer transistor TR1.

As shown in FIG. 13, the thickness tox1 of the gate insulating film Gox1 of the memory cell transistor MT1 is made smaller than the thickness tox2 of the gate insulating film Gox2 of the peripheral transistor Tr and the thickness tox2 of the gate insulating film Gox2 of the peripheral transistor Tr is made smaller than the thickness tox3 of the gate insulating film Gox3 of the transfer transistor TR1 (tox1<tox2<tox3).

Therefore, it is advantageous in attaining the thickness tox1 suitable for operations such as the programming and readout operations of the memory cell transistor MT1 and the thicknesses tox2, tox3 which are required according to voltages applied to the gate electrodes 32, 42.

As shown in FIG. 14, the thickness tox1 of the gate insulating film Gox1 of the memory cell transistor MT1 is made approximately equal to the thickness tox2 of the gate insulating film Gox2 of the peripheral transistor Tr, and the thicknesses tox1, tox2 are made smaller than the thickness tox3 of the gate insulating film Gox3 of the transfer transistor TR1 (tox1, tox2<tox3).

Therefore, the thickness tox2 of the gate insulating film Gox2 of the peripheral transistor Tr can be reduced, the area of the address buffer 19 can be reduced and it is advantageous in miniaturizing the semiconductor integrated circuit device when the required thicknesses of the gate insulating films of the memory cell transistor MT1 and peripheral transistor Tr are set approximately equal to each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
  a memory cell array having a plurality of memory cell transistors arranged in a matrix form, each of the memory cell transistors including a floating gate formed on a gate insulating film, a inter-gate insulating film provided on the floating gate and a control gate provided on the inter-gate insulating film, and
  a high-voltage circuit area arranged in a peripheral area of the memory cell array and including a first high-voltage transistor having a current path which is connected at one end to a selected control gate and a second high-voltage transistor having a current path which is connected at one end to a first non-selected control gate adjacent to the selected control gate and configured to raise voltage applied to the selected control gate to program voltage by use of first capacitive coupling caused between the selected control gate and the first non-selected control gate by applying intermediate voltage approximately equal to voltage which makes the current path of the memory cell transistor conductive to the first non-selected control gate.

2. The semiconductor integrated circuit device according to claim 1, wherein the high-voltage circuit area further includes a third high-voltage transistor having a current path which is connected at one end to a second non-selected control gate adjacent to the selected control gate and configured to raise voltage applied to the selected control gate to the program voltage by use of second capacitive coupling caused between the selected control gate and the second non-selected control gate by applying intermediate voltage approximately equal to voltage which makes the current path of the memory cell transistor conductive to the second non-selected control gate.

3. The semiconductor integrated circuit device according to claim 1, further comprising a low-voltage circuit area arranged in a peripheral area of the memory cell array and having peripheral transistors, the thickness of the gate insulating film of the memory cell transistor being not larger than thickness of the gate insulating film of the peripheral transistor and the thickness of the gate insulating film of the peripheral transistor being smaller than thickness of a gate insulating film of the high-voltage transistor.

4. The semiconductor integrated circuit device according to claim 1, wherein the high-voltage circuit area is a row decoder which selectively activates the memory cell transistors according to an address signal.

5. The semiconductor integrated circuit device according to claim 1, wherein the high-voltage transistor is a transfer transistor which transfers program voltage to the control gate of the memory cell transistor.

6. The semiconductor integrated circuit device according to claim 3, wherein the low-voltage circuit area is an address buffer which decodes an address signal.

7. The semiconductor integrated circuit device according to claim 1, wherein the memory cell array further includes first and second selection transistors and a NAND cell string having current paths of the plurality of memory cell transistors serially connected between the first and second selection transistors.

8. The semiconductor integrated circuit device according to claim 7, further comprising a source line which is connected to a source of one of the first and second selection transistors.

9. The semiconductor integrated circuit device according to claim 8, further comprising a source line driver connected to the source line and configured to generate source voltage.

10. The semiconductor integrated circuit device according to claim 1, further comprising a sense amplifier configured to amplify data read out from a selected one of the memory cell transistors.

11. A programming method of a semiconductor integrated circuit device which includes a memory cell array having a plurality of memory cell transistors arranged in a matrix form, each of the memory cell transistors including a floating gate formed on a gate insulating film, a inter-gate insulating film provided on the floating gate and a control gate provided on the inter-gate insulating film, comprising:

applying voltage lower than program voltage to a selected control gate of a selected one of the memory cell transistors, and raising voltage applied to selected control gate to the program voltage by use of first capacitive coupling caused between the selected control gate and a first non-selected control gate of a non-selected memory cell transistor which is arranged adjacent to the selected control gate by applying intermediate voltage approximately equal to voltage which makes the current path of the memory cell transistor conductive to the first non-selected control gate.

12. The programming method of the semiconductor integrated circuit device according to claim 11, further comprising raising voltage applied to the selected control gate to the program voltage by use of the first capacitive coupling and second capacitive coupling caused between the selected control gate and a second non-selected control gate of a non-selected memory cell transistor which is arranged adjacent to the selected control gate by applying intermediate voltage approximately equal to voltage which makes the current path of the memory cell transistor conductive to the second non-selected control gate.

* * * * *